United States Patent
Petrovic et al.

(10) Patent No.: US 11,736,063 B2
(45) Date of Patent: *Aug. 22, 2023

(54) ADAPTIVE MICROPHONICS NOISE CANCELLATION

(71) Applicant: VIASAT, INC., Carlsbad, CA (US)

(72) Inventors: Branislav A. Petrovic, Falls Church, VA (US); Michail K. Tsatsanis, Huntington Beach, CA (US)

(73) Assignee: VIASAT, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/703,106

(22) Filed: Mar. 24, 2022

(65) Prior Publication Data
US 2022/0216829 A1    Jul. 7, 2022

Related U.S. Application Data

(63) Continuation of application No. 16/952,226, filed on Nov. 19, 2020, now Pat. No. 11,323,066, which is a
(Continued)

(51) Int. Cl.
*H03B 5/02*   (2006.01)
*H03B 5/30*   (2006.01)
(Continued)

(52) U.S. Cl.
CPC ............... *H03B 5/02* (2013.01); *G01S 19/21* (2013.01); *G01S 19/23* (2013.01); *G01S 19/26* (2013.01);
(Continued)

(58) Field of Classification Search
CPC .... H03B 5/30; H03B 5/02; H03L 1/00; H03L 7/099; G01S 19/21; G01S 19/26; G01S 19/1923
(Continued)

(56) References Cited

U.S. PATENT DOCUMENTS

| | | | |
|---|---|---|---|
| 4,891,611 A * | 1/1990 | Frerking | H03L 1/00 331/10 |
| 6,707,346 B2 * | 3/2004 | Tillotson | G04F 5/06 331/158 |

(Continued)

FOREIGN PATENT DOCUMENTS

WO    2015039330    3/2015

OTHER PUBLICATIONS

Malik et al., "Adaptive Equalization Algorithms:An Overview," International Journal of Advanced Computer Science and Applications, vol. 2, No. 3, pp. 62-67 (2011).
(Continued)

*Primary Examiner* — Arnold M Kinkead
(74) *Attorney, Agent, or Firm* — Snell & Wilmer L.L.P.

(57) ABSTRACT

Systems and methods are provided for compensating for mechanical acceleration at a reference oscillator. A reference oscillator provides an oscillator output signal and an accelerometer on a same platform as the reference oscillator, such that mechanical acceleration at the reference oscillator is detected at the accelerometer to produce a measured acceleration. A filter assembly, having an associated set of filter weights, receives the measured acceleration from the accelerometer and provides a tuning control signal responsive to the measured acceleration to a frequency reference associated with the system. An adaptive weighting component receives the oscillator output signal of the reference oscillator and an external signal that is provided from a source external to the platform and adjusts the set of filter weights for the filter assembly based on a comparison of the external signal and the oscillator output signal.

25 Claims, 7 Drawing Sheets

Related U.S. Application Data continuation of application No. 16/223,777, filed on Dec. 18, 2018, now Pat. No. 10,886,877.

(51) Int. Cl.
| | |
|---|---|
| *G01S 19/23* | (2010.01) |
| *G01S 19/26* | (2010.01) |
| *G01S 19/21* | (2010.01) |
| *H03L 7/099* | (2006.01) |
| *H03L 1/00* | (2006.01) |

(52) U.S. Cl.
CPC ................. *H03B 5/30* (2013.01); *H03L 1/00* (2013.01); *H03L 7/099* (2013.01)

(58) Field of Classification Search
USPC ........... 310/314, 348; 331/34, 1 A; 327/156; 375/376
See application file for complete search history.

(56) References Cited

U.S. PATENT DOCUMENTS

| | | | |
|---|---|---|---|
| 6,707,349 B1 | 3/2004 | Huang et al. | |
| 6,714,089 B2 | 3/2004 | Ammar et al. | |
| 7,236,062 B2 | 6/2007 | Chien | |
| 7,768,359 B2 | 8/2010 | Chang et al. | |
| 8,433,255 B2 | 4/2013 | Harnishfeger | |
| 8,446,222 B2 | 5/2013 | Brenndorfer | |
| 8,588,086 B2 | 11/2013 | Tian et al. | |
| 8,866,557 B2 | 10/2014 | Lee et al. | |
| 8,907,734 B2 | 12/2014 | Clark et al. | |
| 9,065,458 B2 | 6/2015 | Longstone et al. | |
| 9,130,576 B2 | 9/2015 | He | |
| 9,246,435 B1 | 1/2016 | Kavousian et al. | |
| 9,825,639 B2 | 11/2017 | Patrizi et al. | |
| 10,886,877 B2 * | 1/2021 | Petrovic | ................. G01S 19/23 |
| 11,323,066 B2 * | 5/2022 | Petrovic | .................... H03L 1/00 |
| 2010/0253402 A1 | 10/2010 | Awata | |
| 2012/0206209 A1 | 8/2012 | Kaufman et al. | |
| 2014/0104006 A1 | 4/2014 | Clark et al. | |
| 2016/0204909 A1 | 7/2016 | Kushnir et al. | |
| 2017/0261618 A1 | 9/2017 | Zhodzishsky et al. | |

OTHER PUBLICATIONS

Rohde, et al.: "A Novel Voltage Controlled High Frequency Crystal Oscillator Circuits"; http://www.ieeeexplore.ws/ ocumenl/ 5339499/; pp. 1-3 (2016).

Wang, et al.: "Phase Noise and Fundamental Sensitivity of Oscillator-Based Reactance Sensors"; http://ieeexplore.ieee.org/documents/ 6504558/; pp. 1-4 (2016).

Non-Final Office Action dated May 29, 2020 in U.S. Appl. No. 16/223,777.

Notice of Allowance dated Sep. 2, 2020 in U.S. Appl. No. 16/223,777.

Non-Final Office Action dated Jul. 8, 2021 in U.S. Appl. No. 16/952,226.

Notice of Allowance dated Dec. 14, 2021 in U.S. Appl. No. 16/952,226.

International Search Report and Written Opinion dated Mar. 24, 2020 in PCT International Patent Application No. PCT/US2019/ 066790.

* cited by examiner

ADAPTIVE MICROPHONICS NOISE CANCELLATION

RELATED APPLICATIONS

This application is a continuation application claiming priority from U.S. patent application Ser. No. 16/952,226 filed Nov. 19, 2020 titled "ADAPTIVE MICROPHONICS NOISE CANCELLATION". U.S. patent application Ser. No. 16/952,226 is a continuation application claiming priority to U.S. patent application Ser. No. 16/223,777 filed Dec. 18, 2018 titled "ADAPTIVE MICROPHONICS NOISE CANCELLATION", now U.S. Pat. No. 10,886,877 issued on Jan. 5, 2021, all of which are incorporated herein in their entirety.

TECHNICAL FIELD

The disclosure relates generally to the field of communications, and more particularly to adaptive microphonics noise cancellation.

BACKGROUND

Microphonics, or microphony, describes the phenomenon wherein certain components in electronic devices transform mechanical vibrations into an undesired electrical signal. Mechanical acceleration, such as vibration or shock, can cause frequency modulation at oscillators, resulting in microphonics phase noise sidebands in signals. Piezoelectrical crystals can be particularly vulnerable to this effect, and mechanical vibration can transiently change the resonant frequency of the crystal and introduce significant phase noise sidebands through inadvertent frequency modulation. This error can propagate and multiply throughout the system, as any oscillator phase locked to the reference oscillator will be affected, such as the sampling clocks for analog-to-digital converters and digital-to-analog converters.

SUMMARY

In accordance with one example, a system includes a reference oscillator that provides an oscillator output signal and an accelerometer on a same platform as the reference oscillator, such that mechanical acceleration at the reference oscillator is detected at the accelerometer to produce a measured acceleration. A filter assembly, having an associated set of filter weights, receives the measured acceleration from the accelerometer and provides a tuning control signal responsive to the measured acceleration to a frequency reference associated with the system. An adaptive weighting component receives the oscillator output signal of the reference oscillator and an external signal that is provided from a source external to the platform and adjusts the set of filter weights for the filter assembly based on a comparison of the external signal and the oscillator output signal.

In accordance with another example, a method is provided for compensating for mechanical acceleration at a reference oscillator. A mechanical acceleration is detected at an accelerometer on a same platform as the reference oscillator to produce a measured acceleration. A tuning control signal responsive to the measured acceleration is provided at a filter assembly having a set of filter weights. The set of filter weights for the filter assembly is adjusted based on a comparison of an external signal that provided from a source external to the platform and an oscillator output signal of the reference oscillator. The tuning control signal is provided to a frequency reference associated with the system.

BRIEF DESCRIPTION OF THE DRAWINGS

The foregoing and other features of the present invention will become apparent to those skilled in the art to which the present invention relates upon reading the following description with reference to the accompanying drawings, in which.

DETAILED DESCRIPTION

Various examples of the systems and methods described herein provide a noise cancellation system that can be used to generate a tuning control signal that modulates the reference oscillator to cancel or minimize the noise caused by mechanical acceleration at the reference oscillator. To this end, the acceleration at the location is measured and provided to an adaptive filter, comprising an associated set of weights, to generate the tuning control signal. The weights can be adapted, at periodic intervals, according to a measured phase error (or frequency error) of an oscillator output signal of the reference oscillator using an external signal provided to the system to account for changes in the response of the reference oscillator to acceleration. Accordingly, a lower cost, non-ruggedized reference oscillator can be used without a significant increase in microphonic noise or the expense and added weight of a mechanical isolation structure. Further, minor variations among reference oscillators introduced during fabrication can be compensated for without time-consuming testing of individual units.

Figure 1:
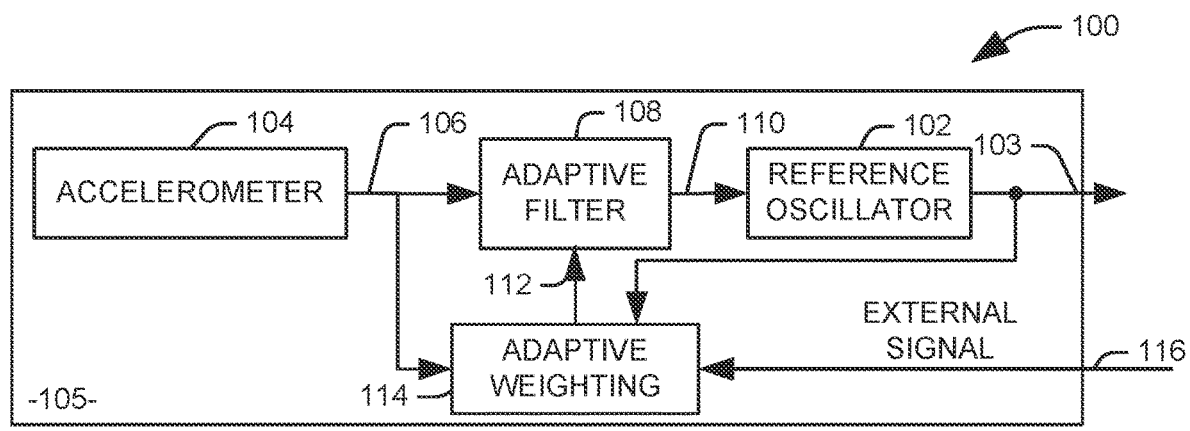
FIG. 1 illustrates a communications system utilizing a reference oscillator.

FIG. 1 illustrates a communications system 100 utilizing a reference oscillator 102 that produces an oscillator output signal 103. The reference oscillator 102 can comprise, for example, an electronic oscillator, such as a Hartley oscillator or a Colpitts oscillator, or a crystal oscillator comprising a piezoelectric crystal. The communications system 100 includes an accelerometer 104 on a same platform 105 as the reference oscillator 102, configured such that any mechanical acceleration at the reference oscillator is detected at the accelerometer. Accordingly, the accelerometer 104 can continuously or periodically produce a measured acceleration 106 representing that experienced at the reference oscillator 102. It will be appreciated that for some implementations of the reference oscillator 102, the oscillator will have varying sensitivity to accelerations from different directions, and the accelerometer 104 can be implemented as a tri-axial accelerometer that measures the acceleration along three mutually perpendicular axes.

The communications system 100 further includes an adaptive filter assembly 108 that receives the measured acceleration 106 from the accelerometer and generates a tuning control signal 110 responsive to the measured acceleration 106 according to a set of filter weights. The tuning control signal 110 is provided to a frequency reference associated with the system, in this implementation, the reference oscillator 102. It will be appreciated, however, that the frequency reference can be another system component that utilizes the output of the reference oscillator 102. It will be appreciated that the filter weights represent the response of the reference oscillator 102 to acceleration, allowing the filter assembly 106 to correct the oscillator for perturbation caused by the measured acceleration.

In some implementations, the response of the reference oscillator 102 to acceleration will vary over time, for example, due to aging of components and changes in the operating environment. Accordingly, the adaptive filter assembly 106 can utilize adaptive weights that are adjusted over time to account for changes in the response of the reference oscillator 102. Since the response of the reference oscillator 102 to acceleration, in general, varies slowly, the adaptation can be slow relative to the system, ranging, for example, between three hertz and two kilohertz. It will be appreciated, however, that the optimization used to produce the weights will take a certain amount of time to converge, and the adaptation must be performed with sufficient frequency to allow the weights to converge faster that the change in the response at the reference oscillator 102. Initial values for the filter weights can be set to accelerate convergence of the filter 106 according to known characteristics of the reference oscillator 102.

The weights for the filter assembly 112 can be provided by an adaptive weighting component 114 that receives the oscillator output signal 103 and an external signal 116. The term "external signal," as it is used herein, refers to a signal provided from a source external to the platform containing the reference oscillator 102. Accordingly, the external signal 116 is generated in a manner that is unaffected by the any acceleration experienced at the reference oscillator. The adaptive weighting component 114 adjusts the set of filter weights 112 for the filter assembly based on a comparison of the external signal and the oscillator output signal. The adaptive weighting component 114 can be implemented in digital logic, for example, as a field programmable gate array or an application specific circuit, in software on a non-transitory computer readable medium executed by an associated processor, or in some combination of hardware and software. It will be appreciated that the adaptive filter assembly 106 can be provided with an initial set of weights at the time of manufacture or installation, with the adaptive filter weights 112 provided periodically to adjust for changes in the response of the reference oscillator 102.

Figure 2:
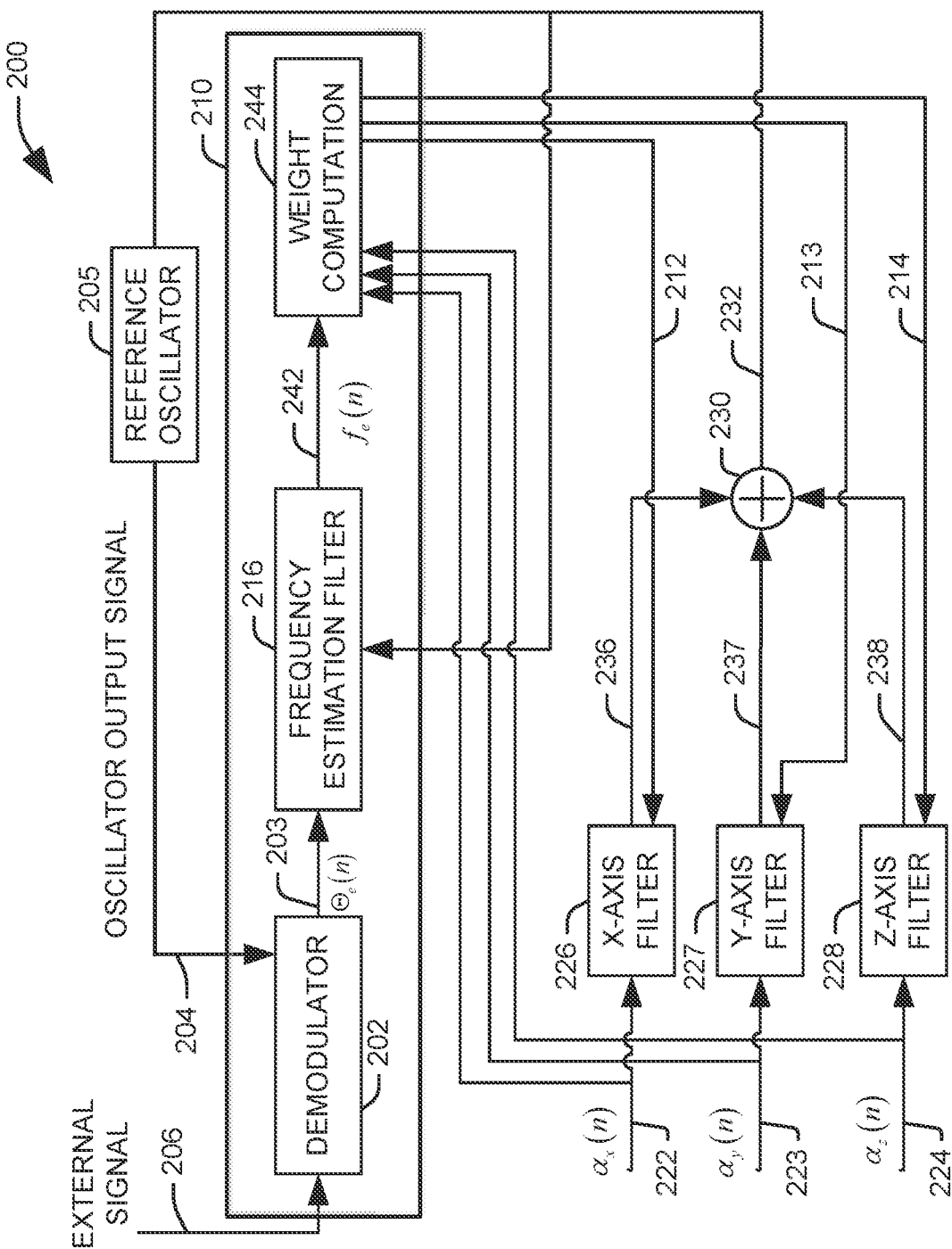
FIG. 2 illustrates one example of an adaptive weighting component that could be used in the system of FIG. 1.

FIG. 2 illustrates one example of an adaptive weighting process 200 incorporating an adaptive weighting component 210 that could be used in the system of FIG. 1. The adaptive weighting component 210 comprises a demodulator 202 that determines a phase error 203, $\Theta_c(n)$, in the oscillator output signal 204 of the reference oscillator 205 from the oscillator output signal 204 and the external signal 206. A frequency estimation filter 216 in the adaptive weighting component 210 calculates an instantaneous frequency, f(n), from the determined phase error 203 in the oscillator output signal. In one implementation, the frequency estimation filter 216 can be a differentiator filter with a frequency response, H(f) =j2πf, a phase difference filter, $f(n)=\Theta_c(n)-\Theta_c(n-1)$, or any other appropriate implementation.

Respective values 222-224 for the acceleration along each axis, as measured at the accelerometer 104, are filtered at respective adaptive filters 226-228 and summed, at an adder 230, to produce a tuning control signal 232, representing a compensation frequency, $f_c(n)$ 232, which is provided to the reference oscillator 205. Each of the respective adaptive filters 222-224 and the adder 230 can be implemented, for example, as digital logic in at a digital signal processor, an application specific integrated circuit, or a field programmable gate array. It will be appreciated that the adaptive filters 226-228 can represent portions of the filter assembly 106 illustrated in FIG. 1, and the respective outputs 236-238 of the adaptive filters 226-228, in combination, provide the tuning signal 110. The tuning control signal 232 is provided to the frequency estimation filter 216 and the compensation frequency represented by the tuning control signal can be compared to the instantaneous frequency to produce a frequency error 242, $f_e(n)$. This frequency error 242 can be utilized at a weight computation component 244, along with the values 222-224 for the acceleration along each axis, to produce new weights for the adaptive filters 226-228 that minimize the frequency error 242. Further, the frequency error signal 242 can be provided to the reference oscillator 205 (not shown in FIG. 2) to adjust its frequency as depicted by line 110 in FIG. 1. In another embodiment, the frequency error signal 242 can be used for digital correction of the frequency as will be discussed in FIG. 6. The weight computation component 244 can employ, for example, algorithms that minimize the mean square of the frequency error, such as the Least Mean Square (LMS) algorithm, the Recursive Least Mean Square algorithm, and gradient descent algorithms.

In one example, a Least Mean Square algorithm is used, with a vector, w, of k filter coefficients for each adaptive filter 226-228, where k is a positive integer greater than 1. The measured acceleration values 222-224 along each axis at a time, n, can be represented as vectors, α, including the k most recent measurements. For a time n+1, the weights for the filter can be calculated as:

$$w_x(n+1)=w_x(n)+\mu\alpha_x(n)f_e(n-d)$$

$$w_y(n+1)=w_y(n)+\mu\alpha_y(n)f_e(n-d)$$

$$w_z(n+1)=w_z(n)+\mu\alpha_z(n)f_e(n-d) \qquad \text{Eq. 1}$$

Where μ is a convergence coefficient, selected according to the implementation, and d is a delay that is calculated to temporally align the frequency estimate from the received phase and the measured acceleration to compensate for filter delays along the two signal paths. It will be appreciated that, when the acceleration measured at the accelerometer 104 is low, for example, when a magnitude of the measured acceleration falls below a predefined threshold value, the adaptive weighting component 210 may stop adjusting the weights at the filters 226-228 for some time to allow the acceleration vectors to populate with meaningful values for the optimization calculation.

Figure 3:
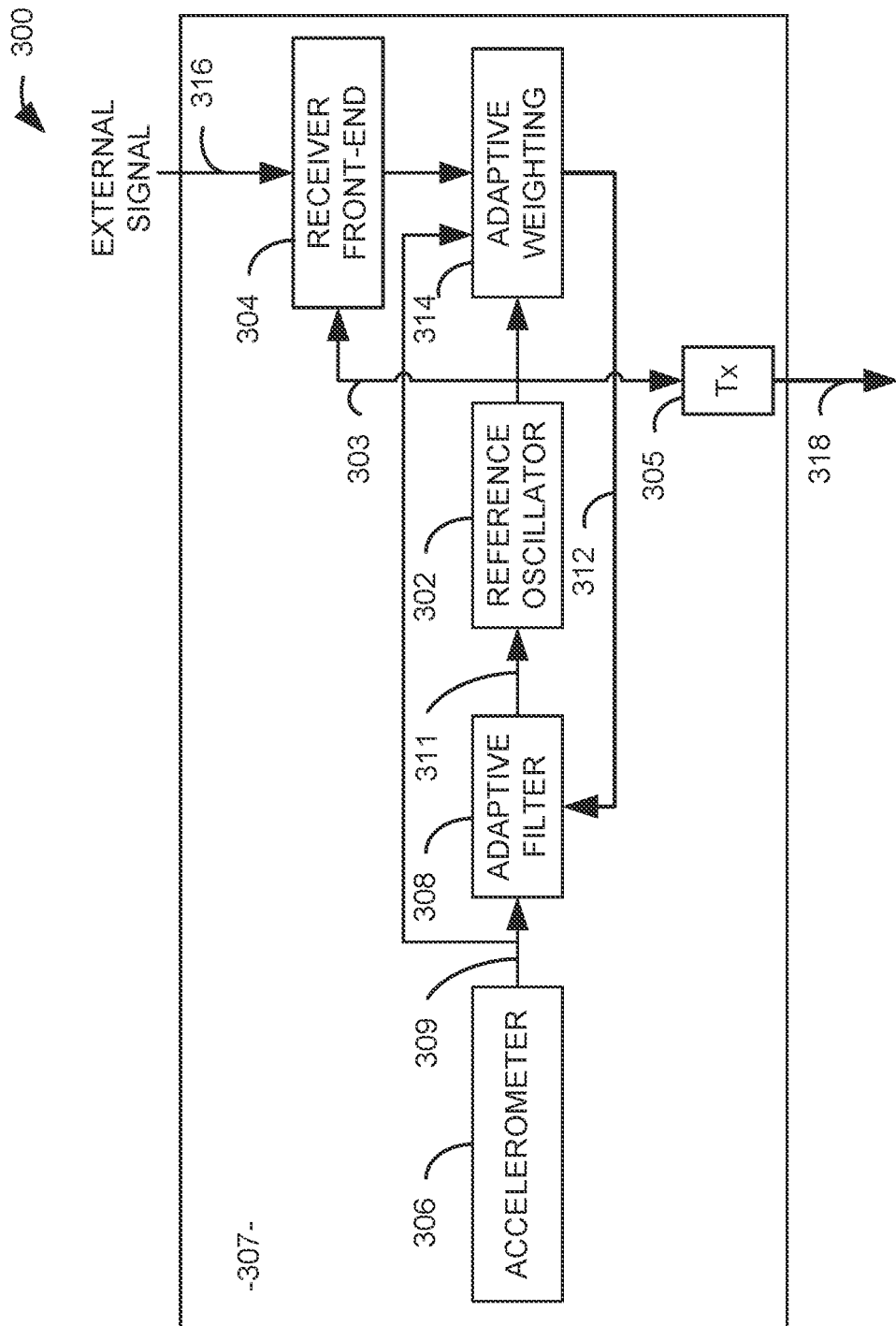
FIG. 3 illustrates one example of a communications system utilizing a reference oscillator that produces an oscillator output signal.

FIG. 3 illustrates one example of a communications system 300 utilizing a reference oscillator 302 that produces an oscillator output signal 303. The oscillator output signal 303 is provided at least to each of receiver front end 304 and a transmitter 305. An accelerometer 306 on a same platform 307 as the reference oscillator 302, detects mechanical acceleration at the platform 307. In the illustrated example, the accelerometer 306 can be implemented as a tri-axial accelerometer. An adaptive filter assembly 308 receives the measured acceleration 309 from the accelerometer 306 and provides a tuning control signal 310 responsive to the measured acceleration to the reference oscillator 302.

A set of weights 312 for the adaptive filter assembly 308 can be determined at an adaptive weighting component 314. An external, clean signal 316 is received at the receiver front-end 304 and provided to the adaptive weighting component 314, along with the measured acceleration 309. It will be appreciated that the oscillator output signal 303 provided to the transmitter 305 is adjusted, at an adaptive filter assembly 308, to remove the effects of acceleration local to the reference oscillator 302. Accordingly, a signal 318 transmitted by the transmitter 305 is a "clean" signal like the external signal 316. The adaptive weighting component 314 can determine a degree of phase error in the oscillator output signal 303 based upon the received external signal 316. From this phase error, the adaptive weighting component 314 determines appropriate weights for the adaptive filter assembly 308 by minimizing a square of a frequency error derived from the phase error. This can be performed periodically to account for changes to the response of the reference oscillator 302 to acceleration due to aging or changes in the operating environment.

Figure 4:
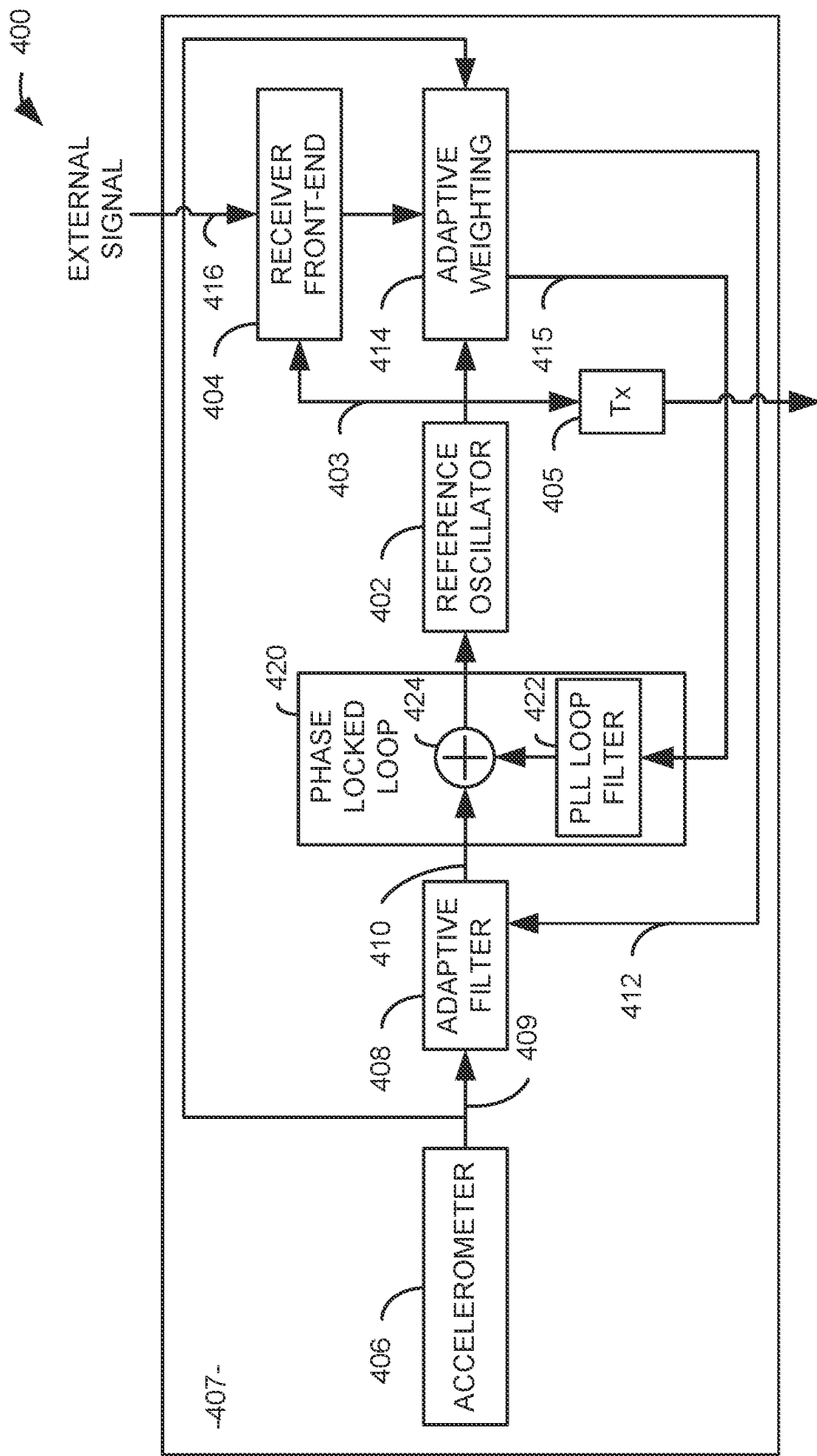
FIG. 4 illustrates another example of a communications system utilizing a reference oscillator that produces an oscillator output signal.

FIG. 4 illustrates another example of a communications system 400 utilizing a reference oscillator 402 that produces an oscillator output signal 403. The oscillator output signal 403 is provided at least to each of a receiver front end 404 and a transmitter 405. An accelerometer 406 on a same platform 407 as the reference oscillator 402, detects mechanical acceleration at the platform 407. In the illustrated example, the accelerometer 406 can be implemented as a tri-axial accelerometer. An adaptive filter assembly 408 receives the measured acceleration 409 from the accelerometer and provides a tuning control signal 410 responsive to the measured acceleration 409. A set of weights 412 for the adaptive filter assembly 408 can be determined at an adaptive weighting component 414.

An external, clean signal 416 is received at the receiver front-end 404 and provided to the adaptive weighting component 414 along with the oscillator output signal 403 and the measured acceleration 409. The adaptive weighting component 414 can estimate a phase error 415, shown as 203 in the example of FIG. 2, in the reference oscillator output based upon the received external signal 416, and determine appropriate weights for the adaptive filter assembly 408 by minimizing a square of a frequency error derived from the phase error 415. This can be performed periodically to account for changes to the response of the reference oscillator 402 to acceleration due to aging or changes in the operating environment. The adaptive weighting component 414 provides the set of weights 412 to the adaptive filter assembly 408.

It will be appreciated that adaptive filter assembly 408 only compensates for frequency error due to microphonics. Other phase and frequency errors, such as Doppler, crystal drift, and scintillation, are not compensated for at the adaptive filter assembly 408. To address these sources of error, the phase error 415 can be further provided to a phase locked loop (PLL) 420. The phase locked loop 420 comprises a phase locked loop filter 422. In one implementation, the phase locked loop filter 422 is implemented as a low pass filter that removes any unwanted high frequency components present in the estimated phase error. The resulting filtered signal can be combined with the output of the adaptive filter assembly 408 at an adder 424 to provide the tuning control signal for the reference oscillator 402.

Figure 5:
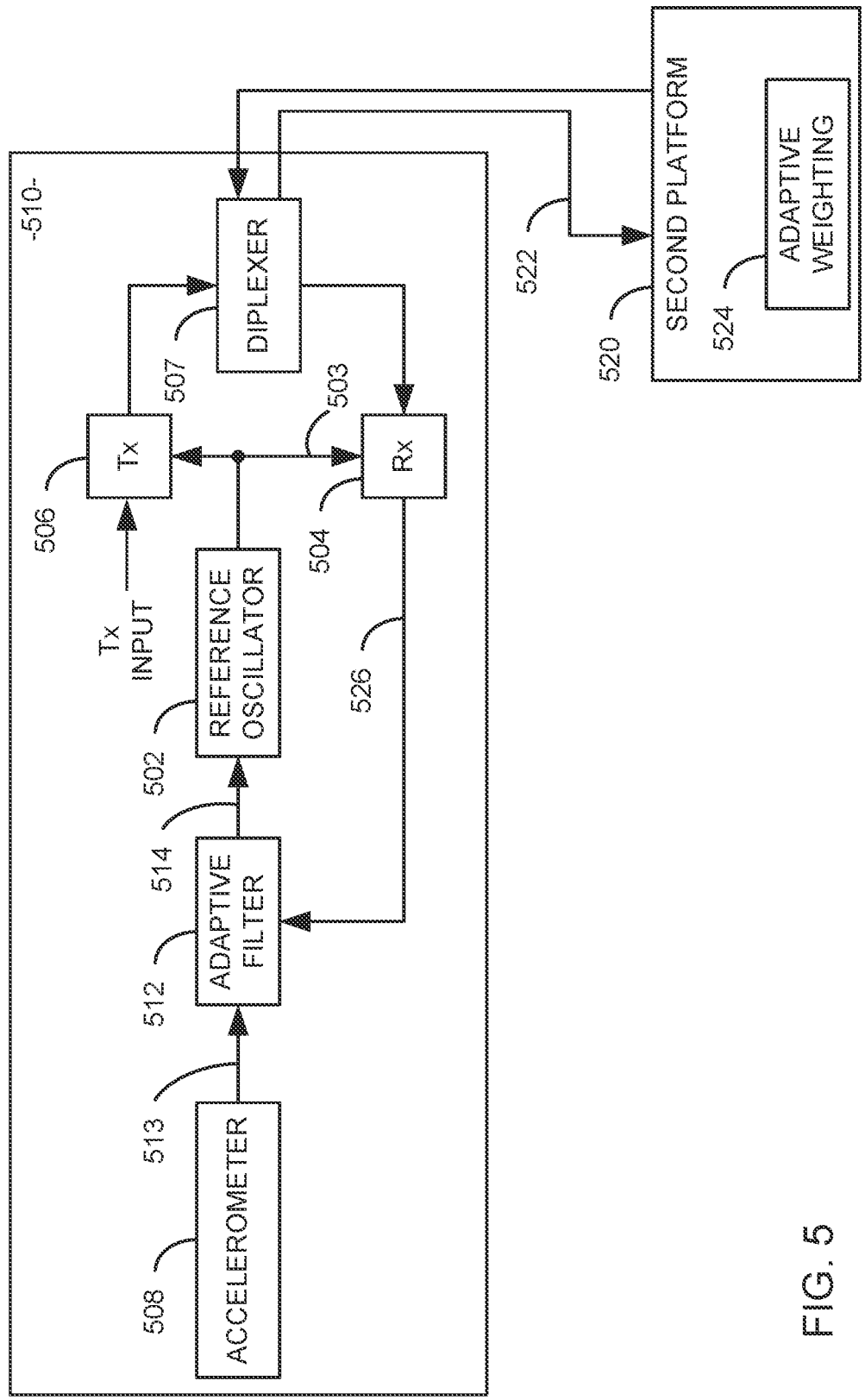
FIG. 5 illustrates yet another example of a communications system utilizing a reference oscillator that produces an oscillator output signal.

FIG. 5 illustrates yet another example of a communications system 500 utilizing a reference oscillator 502 that produces an oscillator output signal 503. The oscillator output signal 503 is provided at least to each of a receiver 504 and a transmitter 506 operating through a diplexer 507. An accelerometer 508 on a first platform 510 with the reference oscillator 502, detects mechanical acceleration at the platform. In the illustrated example, the accelerometer 506 can be implemented as a tri-axial accelerometer. An adaptive filter assembly 512 receives the measured acceleration 513 from the accelerometer and provides a tuning control signal 514 responsive to the measured acceleration. The measured acceleration is also provided to the transmitter 506 for transmission to a second platform 520. In one example, the first platform 510 is a user terminal in a communications system, the second platform 520 is a satellite access node, and the communication between the first platform and the second platform occurs via a satellite connection. Alternatively or additionally, the first platform 510 can be a mobile platform, for example, implemented on an automobile, a watercraft, and aircraft, a train, or other vehicle. It will be appreciated, however, that other configurations of the system are possible, for example, with one or more user terminals used to correct for vibration at a satellite access node or for correction between two user terminals.

The implementation of FIG. 5 exploits the fact that a signal 522 transmitted from the transmitter 506 on the first platform 510 will contain any of the microphonic error induced by mechanical vibration on the platform that has not been corrected by other means, whereas components located on the second platform 520 will be unaffected by any mechanical acceleration at the first platform 510. Accordingly, the transmitted signal 522 can be received at the second platform 520 and demodulated at an adaptive weighting component 524 associated with a local receiver (not shown). A phase error in the signal can be determined during demodulation via a frequency reference (not shown) local to the second platform, and the phase error can be used at the adaptive weighting component 516, to determine appropriate weights for the adaptive filter assembly 512 by minimizing a square of a frequency error derived from the phase error. The determination of the appropriate weights by the second platform also require acceleration information, which is communicated to the second platform by the first platform (not shown). The calculated weights 526 can then be transmitted to the first platform 510 via the receiver 504 for use at the adaptive filter assembly 512. In an alternative implementation, the adaptive weighting component 516 can be distributed across the first platform 510 and the second platform 520. In this implementation, a value indicative of the frequency error, such as the frequency error, the phase error, or any other indication that can be used to determine the frequency error, is determined at the second platform 520 can be transmitted to the first platform 510 for use in computing the filter weights 526.

It will be appreciated that the exchange of the accelerometer data and the filter weights represents overhead in the communications system. To reduce this overhead, the rate of updates to the weights can be limited, with the weights updated either periodically or on a predetermined time schedule. When the weights are not being updated, the most recently updated value can be maintained and utilized at the adaptive filter assembly 512 to correct for mechanical acceleration at the first platform 510. Since the change in the response of the reference oscillator 502 to acceleration changes slowly, gating the update function is this manner allows for a savings of overhead in the system with a minimal loss of accuracy in the oscillator output signal.

Figure 6:
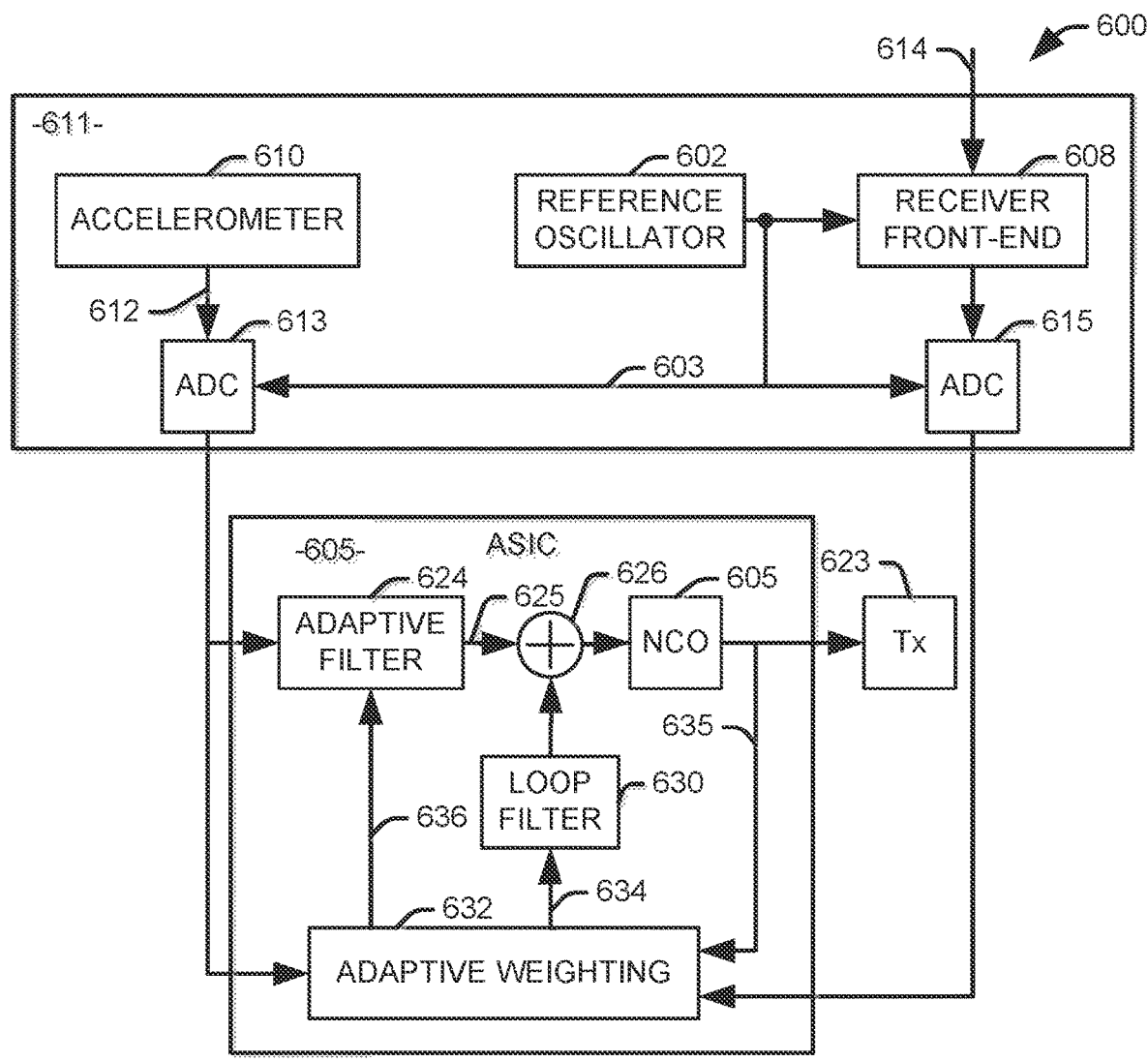
FIG. 6 illustrates a further example of a communications system utilizing a reference oscillator that produces an oscillator output signal.

FIG. 6 illustrates yet another example of a communications system 600 utilizing a reference oscillator 602 that produces an oscillator output signal 603. The oscillator output signal is used to drive numerically controlled oscillators at least one application specific integrated circuit (ASIC) 605, as well as an associated receiver front-end 608. It will be appreciated that this implementation is provided merely for the purpose of example, and that other implementations of the numerically controlled oscillators can be used, such as field programmable gate arrays. An accelerometer 610 on a same platform 611 as the reference oscillator 602, detects mechanical acceleration at the platform. In the illustrated example, the accelerometer 610 can be implemented as a tri-axial accelerometer. The output 612 of the accelerometer 610 can be provided to each ASIC 605, via a first analog-to-digital converter (ADC) 613. Similarly, an external, clean signal 614 is received at the receiver front-end 608 and provided to the ASIC 605 via a second ADC 615.

An exemplary ASIC 605, containing a numerically controlled oscillator 622 that provides a reference signal for an associated transmitter 623, is illustrated in detail. In the ASIC 605, an adaptive filter assembly 624 receives the measured acceleration 612 from the accelerometer 610 and provides a tuning control signal 625 responsive to the measured acceleration 612. The tuning control signal 625 from the adaptive filter assembly 624 can be supplemented by an additional tuning signal from a loop filter 630 at an associated adder 626, in order to track other sources of frequency error like Doppler shifts, oscillator drifts, etc. as discussed in connection with FIG. 4. It will be appreciated that the numerically controlled oscillator 622 can receive the digital tuning signal, and it is thus unnecessary to convert the digital output of the adaptive filter assembly 624 to an analog signal.

Each of the external signal 614, an output 628 of the numerically controlled oscillator 622, and the output 612 of the accelerometer 610 is provided to an adaptive weighting component 632. The adaptive weighting component 632 includes a demodulator (not shown) that estimates a phase error 634, shown as 203 in the example of FIG. 2, in the numerically controlled oscillator output 634 based upon the external signal 614. This phase error 634 is provided to the loop filter 630 for tracking other sources of frequency error, as described previously. The adaptive weighting component utilizes the estimated phase error, along with the accelerometer output 612 to estimate a frequency error and determine appropriate weights for the adaptive filter assembly 624 that minimize a square of the frequency error.

Figure 7:
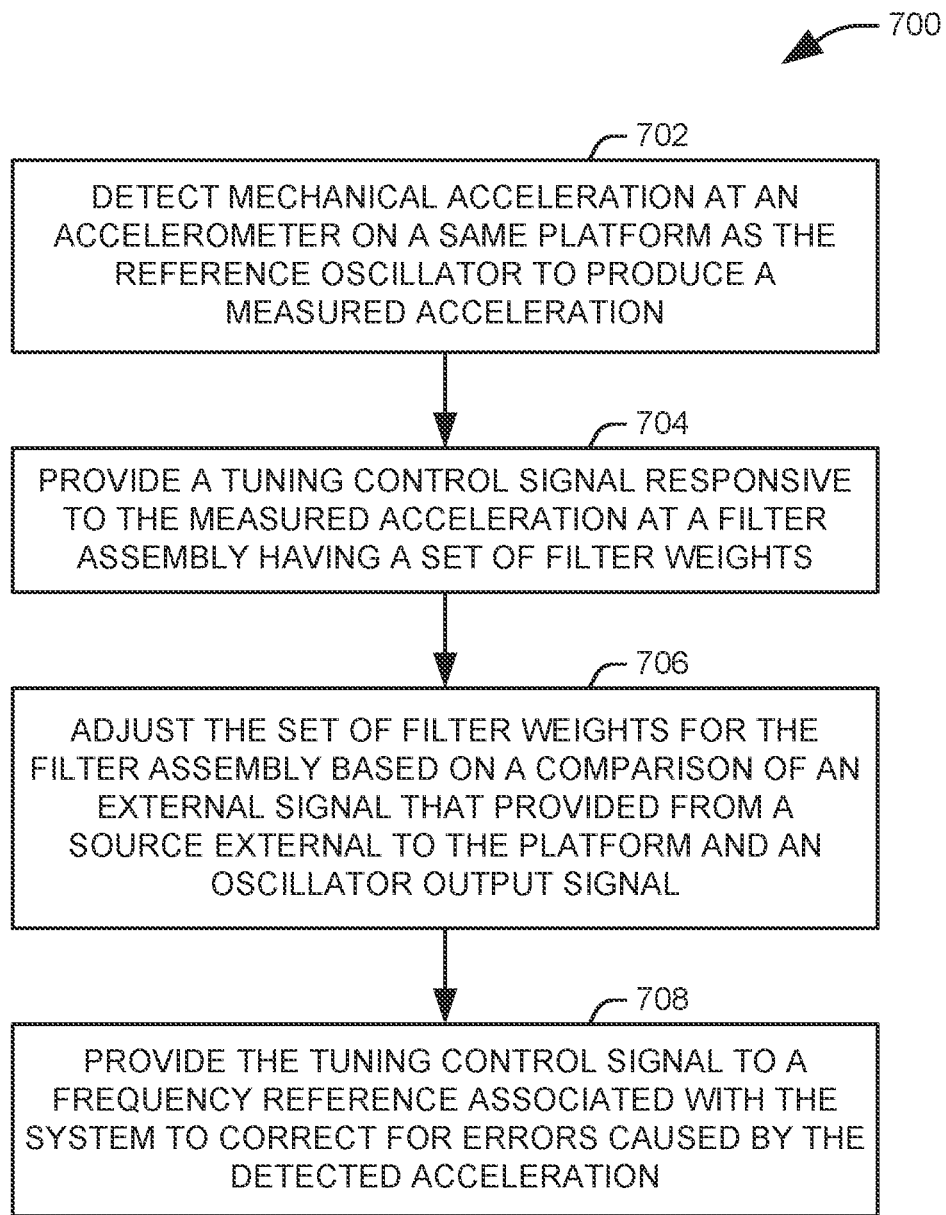
FIG. 7 illustrates a method for compensating for mechanical acceleration at a reference oscillator.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method FIG. 7 illustrates an example of a method 700 for compensating for mechanical acceleration at a reference oscillator. At 702, mechanical acceleration is detected at an accelerometer on a same platform as the reference oscillator to produce a measured acceleration. At 704, a tuning control signal responsive to the measured acceleration is provided at a filter assembly having a set of filter weights. At 706, the set of filter weights for the filter assembly is adjusted based on a comparison of an external signal that provided from a source external to the platform and an oscillator output signal. For example, a phase error in the oscillator output signal can be determined from the external signal and the oscillator output signal, a frequency error can be estimated and the set of filter weights can be adjusted according to the determined frequency error.

It will be appreciated that determining the adjustment to the set of filter weights can be performed locally, remotely, or at a combination of local and remote components. In one example, a signal is generated using the oscillator output signal is transmitted from the platform to a remote platform, and a phase error in the oscillator output signal is calculated from the external signal, which is generated at the remote platform, and the signal generated from the oscillator output signal. The calculated phase error is then transmitted to the platform, and the set of filter weights for the filter assembly is adjusted from the calculated phase error at the remote platform. In one implementation, the set of filter weights for the filter assembly is determined only periodically, such that the accelerometer and the filter are active at times when the set of filter weights is not being determined.

At 708, the tuning control signal is provided to a frequency reference associated with the system to correct for errors caused by the detected acceleration. In one implementation, the frequency reference is the reference oscillator. In another implementation, the frequency reference is at least one numerically controller oscillator driven by the oscillator output signal. It will be appreciated that the tuning control signal can correct for errors other than that caused by the mechanical acceleration. In one implementation, a correction value can be calculated at a phase locked loop to account for additional sources of phase and frequency error, and the correction value can be added to the tuning control signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
a filter assembly, having an associated set of filter weights, that receives a measured acceleration from an accelerometer on a same platform as a reference oscillator and that provides a tuning control signal responsive to the measured acceleration to a frequency reference associated with the system; and
an adaptive weighting component that receives an oscillator output signal from the reference oscillator, the measured acceleration from the accelerometer, and an external signal that is provided from a source external to the platform and calculates the set of filter weights for the filter assembly based on a comparison of the external signal and the oscillator output signal and the measured acceleration.

2. The system of claim 1, wherein the frequency reference is the reference oscillator, and wherein the adaptive weighting component is configured to continuously or periodically calculate the set of filter weights.

3. The system of claim 1, further comprising:
the reference oscillator that provides the oscillator output signal; and
the accelerometer that is on the same platform as the reference oscillator.

4. The system of claim 3,
wherein the reference oscillator, the accelerometer, the filter assembly, and the adaptive weighting component are all on the same platform, and
wherein the external signal is provided from a remote location via a receiver at the platform.

5. The system of claim 1, wherein the frequency reference is from at least one numerically controlled oscillator driven by the oscillator output signal.

6. The system of claim 1, further comprising a phase locked loop that computes a correction value from the comparison of the external signal and the oscillator output signal and that adds the correction value to the tuning control signal.

7. The system of claim 1, wherein the adaptive weighting component does not calculate the set of filter weights when a magnitude of the measured acceleration falls below a threshold value.

8. The system of claim 1, wherein the oscillator output signal is provided as a reference to a transmitter, such that a signal transmitted by the transmitter is not impacted by the measured acceleration at the reference oscillator.

9. The system of claim 3,
wherein the platform is a first platform,
wherein the filter assembly is also on the first platform,
wherein the adaptive weighting component is on a second platform remote from the first platform,
wherein a first transmitter on the first platform transmits the oscillator output signal to the second platform, and
wherein a second transmitter on the second platform transmits the set of filter weights to the first platform.

10. The system of claim 3,
wherein the platform is a first platform,
wherein the filter assembly is also on the first platform,
wherein the adaptive weighting component is distributed across the first platform and a second platform remote from the first platform,
wherein a first transmitter on the first platform transmits the oscillator output signal to the second platform, and
wherein a second transmitter on the second platform transmits an indication of a frequency error in the oscillator output signal to the first platform.

11. The system of claim 1, wherein the adaptive weighting component comprises:
a demodulator that determines a phase error in the oscillator output signal from the oscillator output signal and the external signal; and
a weight computation component that calculates the set of filter weights based on the determined phase error in the oscillator output signal.

12. The system of claim 11, wherein:
the adaptive weighting component further comprises a frequency estimation filter that calculates an instantaneous frequency from the determined phase error in the oscillator output signal, a compensation frequency is represented by the tuning control signal, and
wherein the weight computation component determines values for the set of filter weights that minimize a difference between the instantaneous frequency and the compensation frequency.

13. The system of claim 11, further comprising a phase locked loop that computes a correction value from the phase error in the oscillator output signal and that adds the correction value to the tuning control signal.

14. The system of claim 1, wherein the external signal is provided via a satellite associated with the system.

15. The system of claim 3,
wherein the accelerometer is a three-axis accelerometer that produces the measured acceleration based on values of acceleration along each of first, second, and third axes, and
wherein the set of filter weights includes a subset of filter weights for each of the first, second, and third axes.

16. A method for compensating for mechanical acceleration at a reference oscillator comprising:
receiving, by a filter assembly having an associated set of filter weights and an adaptive weighting component that adjusts the set of filter weights for the filter assembly, a measured acceleration from an accelerometer on a first platform, wherein the reference oscillator is on the first platform;
providing, by the filter assembly, a tuning control signal responsive to the measured acceleration;
adjusting, by the adaptive weighting component, the set of filter weights for the filter assembly based on a comparison of an oscillator output signal of the reference oscillator and an external signal that is provided from a remote location via a receiver and the measured acceleration; and
providing the tuning control signal to a frequency reference associated with a noise cancellation system.

17. The method of claim 16, wherein the filter assembly is on the first platform with the accelerometer and the reference oscillator.

18. The method of claim 16, wherein the frequency reference is the reference oscillator.

19. The method of claim 16, wherein adjusting the set of filter weights for the filter assembly comprises:
transmitting a signal generated from the oscillator output signal from the first platform to a remote platform;
calculating a frequency error in the oscillator output signal from the external signal and the signal generated from the oscillator output signal, the external signal being generated at the remote platform;
transmitting an indication of the calculated frequency error to the first platform; and
making an adjustment to the set of filter weights for the filter assembly from the calculated frequency error at the remote platform.

20. The method of claim 16, further comprising:
computing a correction value at a phase locked loop; and
adding the correction value to the tuning control signal.

21. The method of claim 16, wherein the set of filter weights for the filter assembly is adjusted only periodically, such that the accelerometer and the filter assembly are active at times when the set of filter weights is not being determined.

22. The method of claim 16, wherein adjusting the set of filter weights for the filter assembly comprises:

determining a phase error in the oscillator output signal from the external signal and the oscillator output signal; and making an adjustment to the set of filter weights from the determined phase error.

23. A system comprising:

a filter assembly configured to:
 receive a measured acceleration signal indicative of mechanical acceleration experienced by a reference oscillator that provides an oscillator output signal;
 receive an estimated phase error in the oscillator output signal; and
 generate a tuning control signal responsive, at least in part, to the measured acceleration signal according to a set of filter weights, wherein the tuning control signal is configured to correct for errors caused by the mechanical acceleration and other sources of error;

and an adaptive weighting component configured to:
 receive the measured acceleration signal;
 generate the estimated phase error based on an external signal and the oscillator output signal, wherein the external signal is generated by a source that does not experience the mechanical acceleration;
 estimate a frequency error based at least in part on the estimated phase error and the measured acceleration signal;
 adjust the set of filter weights based at least in part on the estimated phase error and the measured acceleration signal.

24. The system of claim 23, wherein the measured acceleration signal is indicative of mechanical acceleration in at least one of a plurality of axes, and wherein the system further comprises a three-axis accelerometer that provides the measured acceleration along each of first, second, and third axes of the plurality of axes, wherein the set of filter weights includes a subset of filter weights for each of the first, second, and third axes.

25. The system of claim 23, further comprising a signal generator configured to provide a reference signal for an associated transmitter based on the tuning control signal in response to being driven by the oscillator output signal.

* * * * *